United States Patent [19]

Hosoda et al.

[11] Patent Number: 4,726,859
[45] Date of Patent: Feb. 23, 1988

[54] WIRE FOR BONDING A SEMICONDUCTOR DEVICE

[75] Inventors: Naoyuki Hosoda; Naoki Uchiyama; Toshiaki Ono, all of Osaka; Ryusuke Kawanaka, Toyonaka, all of Japan

[73] Assignees: Mitsubishi Kinzoku Kabushiki Kaisha; Mitsubishi Denki Kabushiki Kaisha, both of Tokyo, Japan

[21] Appl. No.: 845,176

[22] Filed: Mar. 27, 1986

[30] Foreign Application Priority Data

Mar. 29, 1985 [JP] Japan .................................. 60-65142
Jun. 28, 1985 [JP] Japan ................................. 60-141822
Jul. 22, 1985 [JP] Japan ................................. 60-161666
Oct. 22, 1985 [JP] Japan ................................. 60-235988

[51] Int. Cl.$^4$ .............................................. C22C 9/00
[52] U.S. Cl. ................................. 148/432; 148/11.5 C
[58] Field of Search ................. 148/432, 411, 11.5 C; 420/497, 500, 469

[56] References Cited

U.S. PATENT DOCUMENTS 4,311,522 1/1982 Batra et al. ......................... 148/432

Primary Examiner—R. Dean
Attorney, Agent, or Firm—Frishauf, Holtz, Goodman & Woodward

[57] ABSTRACT

An inexpensive, very fine wire of high-purity copper is disclosed as an alternative to the fine gold wire which is currently used in the bonding of semiconductor devices. The very fine wire of high-purity copper is prepared from a copper ingot that contains 0–2 ppm of S, 0–2 ppm of Ag, 0–1 ppm of Se and 0–1 ppm of Te as incidental impurities with the total content of these and any other incidental impurities present being held at a level not exceeding 10 ppm. By subjecting it to an appropriate heat treatment, the wire acquires an elongation of 5–22%, a breaking strength of 14–33 kg/mm$^2$, and a Vickers hardness of 38–50, the latter value being measured with respect to said high-purity copper in an ingot form. By reducing the amounts of these impurities to even lower levels, very fine wires are obtained that can be used in the bonding of a semiconductor device without abnormally shaped loops being formed or wire breakage being experienced and the characteristics of the wires can be adapted to specific conditions of use by performing an appropriate heat treatment.

4 Claims, No Drawings

WIRE FOR BONDING A SEMICONDUCTOR DEVICE

TECHNICAL FIELD

The present invention relates to a very fine wire of high-purity copper for use in the bonding of a semiconductor device.

BACKGROUND ART

ICs as semiconductor devices which also include transistors and LSIs in their category are typically fabricated by the following steps:

(a) provide a lead frame material that is made of a strip of Cu alloy having a thickness of 0.1–0.3 mm;

(b) etch or stamp out a lead frame conforming to the shape of the ICs to be fabricated;

(c) apply high-purity Si or Ge semiconductor chips to selected areas in the lead frame by thermocompression with an electrically conductive resin such as Ag paste, or by soldering with a plating of Au, Ag, Ni, Cu or an alloy thereof formed on the mating surfaces of each semiconductor chip and the lead frame, or by Au brazing;

(d) connect each semiconductor chip to the lead frame by bridging them with very fine Au bonding wires;

(e) enclose with a protective plastic package the semiconductor chips, gold wires and parts of the lead frame to which the chips have been bonded; and (f) cut the lead frame into discrete ICs.

The very fine Au wires conventionally employed as bonding wires in the fabrication of semiconductor devices are expensive and increasing attention is being drawn to using less expensive oxygen-free copper in the form of a very fine wire. However, an ingot of the conventional oxygen-free copper is fairly hard (Hv: 50–60), so if a very fine wire drawn from this ingot is applied to the Si semiconductor chip in the bonding step, the ball forming at the wire tip may frequently damage the wiring Al alloy coat on the chip, or may even sometimes cause microcracking in the chip. A further problem results from the low elongation of the very fine oxygen-free Cu wire: not only is considerable difficulty encountered with forming and retaining the proper shape of a wire loop at bonding but also the wire has a great tendency to break without being connected to the appropriate area in the lead frame.

SUMMARY OF THE INVENTION

The principal object of the present invention is to provide a very fine high-purity copper wire that is suitable for use as a wire in the bonding of a semiconductor device in terms of such factors as elongation, breaking strength, the hardness of a copper ingot from which the wire is drawn, the shape of the loop which the wire makes during bonding, and the frequency of wire breakage. This object of the present invention can be attained by a very fine wire for bonding a semiconductor device that is made of a high-purity copper containing 0–2 ppm of S, 0–2 ppm of Ag, 0–1 ppm of Se and 0–1 ppm of Te, with the total content of these and any other incidental impurities present being held at a level not exceeding 10 ppm, said very fine wire having an elongation of 5–22%, a breaking strength of 14–33 kg/mm$^2$, and a Vickers hardness of 38–50, the latter value being measured with respect to said high-purity copper in an ingot form.

DETAILED DESCRIPTION OF THE INVENTION

The present inventors have made concerted efforts to attain this object, and as a result, the inventors obtained the following observations: the conventional very fine oxygen-free copper wire contains 5–10 ppm of S, 5–10 ppm of Ag, 0.4–1 ppm of Se and 0.5–1 ppm of Te as incidental impurities; if the respective amounts of these impurities are reduced to the ranges of 0–2 ppm, 0–2 ppm, 0–1 ppm and 0–1 ppm, and if the total content of these and any other impurities present is reduced from the conventional 50–100 ppm range to a value of not more than 10 ppm, a soft ingot of oxygen-free copper having a Vickers hardness of 38–50 can be obtained. If a wire drawn from this high-purity copper into a very small diameter is subjected to the final step of heat treatment (typically bright annealing), the wire acquires an elongation of 5–22% and a breaking strength within the range of 14–33 kg/mm$^2$ (equivalent to a breaking load of 7–16 g on a wire with a diameter of 25 $\mu$m). The so obtained wire is highly suitable for use in the bonding of semiconductor devices.

The above-specified upper limits for the amounts of S, Ag, Se and Te and for the total content of these and other incidental impurities present in the bonding wire of the present invention have been determined empirically by conducting many runs of experiments. If the respective amounts of S, Ag, Se and Te, and the total content of these and other impurities exceed the specified upper limits, the properties of the ingot will suddenly change to those which are unsuitable for making very fine wires that can be reliably used in the bonding of semiconductor devices.

The present inventors continued their studies with a view to providing further improved fine wires of high-purity oxygen-free copper and obtained the following observations:

(1) A very fine copper wire that has an elongation of 14–22% and a breaking strength within the range of 16–26 kg/mm$^2$ (equivalent to a breaking load of 8–13 g on a wire diameter of 25 $\mu$m) and which has a Vickers hardness of 38–45 as measured in an ingot form can be obtained from an ingot containing 0–0.5 ppm of S, 0–0.2 ppm of Se, and 0–0.2 ppm of Te as incidental impurities, with the total content of these and any other impurities present being not more than 5 ppm.

(2) By selecting appropriate conditions for the heat-treatment (typically bright annealing) conducted in the final step of wire making, a very fine copper wire that has an elongation of 5 to less than 14% and a breaking strength within the range of 18–28 kg/mm$^2$ (equivalent to a breaking load of 8.8–15.2 g on a wire with a diameter of 25 $\mu$m) and which has a Vickers hardness of 38–45 as measured in an ingot form can be obtained from an ingot having the same composition as specified in 1.

The wire so obtained will form a loop of the appropriate shape when it is bonded between the lead frame and a specific IC chip. In addition, the wire has a good elongation characteristic and can be reliably used in the bonding of an IC with a large number of pins because individual bonded wires are sufficiently resistant to the stream of liquid (ca. 150° C.) molding resin and will not deform such as to assume an undesirable shape that might cause electrical shorting.

(3) If the levels of S, Ag, Se and Te as incidental impurities are reduced to the respective ranges of 0–0.5 ppm, 0–0.5 ppm, 0–0.2 ppm and 0–0.2 ppm while the total content of these and other impurities present is held at a level not exceeding 5 ppm, an ingot having a Vickers hardness of 38–45 is obtained and a wire drawn from this ingot into a very small diameter will acquire an elongation of 5–22% and a breaking strength of 16–28 kg/mm$^2$ if a heat treatment (typically bright annealing) is performed in the final step of wire fabrication. If the conditions of the heat treatment are properly selected, a wire having an elongation of 5 to less than 14% is produced and it can be reliably used as a bonding wire without defoming undesirably during encapsulation with a molding resin. Therefore, if a high-purity oxygen-free copper ingot having the composition specified above is provided, a variety of bonding wires that are adapted to particular conditions of use can be obtained by properly selecting the conditions of the heat treatment conducted in the final step of wire fabrication.

The present invention has been accomplished on the basis of these findings.

The bonding wire of the present invention is hereunder described in greater detail with reference to the following examples.

EXAMPLE 1

Oxygen-free copper was purified by repeated cycles of routine electrolysis or zone melting. Thereafter, the copper was subjected to the customary vacuum melting, thereby producing ingots of high-purity copper having the compositions shown in Table 1. After measuring the Vickers hardness, the ingots were drawn into very fine wires (25 μm in dia.) by repeated cycles of conventional hot and cold rolling steps. The wires were subjected to bright annealing by holding them at temperatures between 300° and 400° C. for a period ranging from 1 to 2 seconds. By these procedures, five wire samples of the present invention and three comparative samples were obtained.

The elongation and breaking strength of each wire sample were measured and the results are shown in Table 1. The wires then were used in bonding IC chips to a lead frame, and the shape of each wire loop was observed microscopically. The bonded wires were also checked with a microscope for any breakage occurring at the lead frame.

TABLE 1

| Sample | Impurities in Cu ingot (ppm) | | | Ingot hardness (Hv) | Wire elongation (%) | Breaking strength of wire (kg/mm$^2$) |
| --- | --- | --- | --- | --- | --- | --- |
|  | S | Ag | total |  |  |  |
| Samples of the Invention |  |  |  |  |  |  |
| 1 | 0.3 | 0.9 | 4.7 | 40.6 | 19.3 | 18.9 |
| 2 | 0.6 | 1.5 | 5.9 | 42.7 | 18.1 | 23.0 |
| 3 | 1.2 | 1.3 | 7.3 | 45.3 | 15.5 | 24.0 |
| 4 | 1.6 | 1.9 | 8.8 | 47.1 | 12.3 | 24.6 |
| 5 | 1.9 | 1.1 | 9.7 | 49.3 | 10.4 | 25.5 |
| Comparative Samples |  |  |  |  |  |  |
| 1 | 2.6* | 1.2 | 7.4 | 51.3 | 9.5 | 22.2 |
| 2 | 0.6 | 2.9* | 8.1 | 53.4 | 8.6 | 23.0 |
| 3 | 0.5 | 1.4 | 11.8* | 55.1 | 7.9 | 25.9 |

(Values with an asterisk are outside the scope of the present invention.)

All of the wire samples tested contained no more than 1 ppm of Se or Te when they were in an ingot form.

As Table 1 shows, each of the five samples of wire prepared in accordance with the present invention possessed values of elongation, breaking strength and ingot hardness that were suitable for use in the bonding of a semiconductor device. When these wires were bonded between an IC chip and a lead frame, they formed loops of normal shape in almost all cases, with minimum occurrence of wire breakage. On the other hand, the comparative wire samples that exceeded the upper limit either for the levels of individual impurities or for the total content of impurities present had lower values of elongation while exhibiting undesirably increased values of ingot hardness. These samples were therefore far from being satisfactory as bonding wires and the bonded wires formed loops of abnormal shapes and experienced frequent breakage.

EXAMPLE 2

Ingots of high-purity copper having the impurity levels shown in Table 2 were produced by repeating the procedures of Example 1. After measuring the Vickers hardness, the ingots were worked into wire samples (Nos. 6–14) of the present invention as described in Example 1. The elongation and breaking strength of each wire sample were measured and the results are shown in Table 2. The wires were subsequently used in bonding IC chips to a lead frame, and the shape of each wire loop was observed microscopically. The bonded wires were also checked with a microscope for any breakage occurring at the lead frame.

TABLE 2

| Sample | Impurities in Cu ingot (ppm) | | | | Ingot hardness (Hv) | Wire elongation (%) | Breaking strength of wire (kg/mm$^2$) |
| --- | --- | --- | --- | --- | --- | --- | --- |
|  | S | Se | Te | total |  |  |  |
| Samples of the Invention |  |  |  |  |  |  |  |
| 6 | 0.20 | 0.11 | 0.12 | 4.0 | 38.2 | 21.8 | 17.9 |
| 7 | 0.25 | 0.08 | 0.15 | 4.5 | 39.9 | 20.9 | 18.3 |
| 8 | 0.30 | 0.15 | 0.10 | 4.2 | 40.6 | 19.4 | 19.0 |
| 9 | 0.40 | 0.10 | 0.17 | 3.9 | 42.9 | 17.2 | 23.2 |
| 10 | 0.47 | 0.18 | 0.12 | 4.8 | 44.3 | 14.2 | 25.1 |
| 11 | 0.60 | 0.12 | 0.10 | 4.6 | 46.5 | 12.8 | 24.3 |
| 12 | 0.40 | 0.25 | 0.15 | 4.3 | 46.9 | 12.4 | 24.5 |
| 13 | 0.38 | 0.16 | 0.24 | 4.4 | 47.3 | 11.8 | 24.7 |
| 14 | 0.35 | 0.14 | 0.16 | 5.8 | 45.4 | 13.2 | 24.1 |

As Table 2 shows, each of the wire samples tested possessed values of elongation, breaking strength and ingot hardness that were suitable for use in the bonding of a semiconductor device. Sample Nos. 6 to 10 each containing less than 0.5 ppm of S less than 0.2 ppm of Se, less than 0.2 ppm of Te and less than 5 ppm of the impurities taken together provided loops of normal shape and experienced no wire breakage during bonding operations. On the other hand, Sample Nos. 11 to 14 that exceeded the upper limit either for the levels of individual impurities or for the total content of impurities present sometimes provided deformed loops or experienced wire breakage. Therefore, as far as the shape of wire loop and the frequency of wire breakage are concerned, bonding wires having a higher reliability and performance can be obtained by reducing the S, Se and Te levels to less than 0.5, 0.2 and 0.2 ppm, respectively, with the total content of these and other impurities present being held at less than 5 ppm.

EXAMPLE 3

Copper ingots having the impurity levels shown in Table 3 were prepared by repeating the procedures of Example 1. After measuring their Vickers hardness, the ingots were drawn into very fine wires (25 μm in dia.) as described in Example 1. The wires were subsequently bright-annealed by exposing them to the temperatures indicated in Table 3 for a period of 1.5 seconds. By these procedures, ten bonding wire samples of the present invention (Nos. 15 to 24) and five comparative samples (Nos. 4 to 8) were obtained.

The elongation and breaking strength of each sample were measured, and the results are shown in Table 3. Thereafter, Sample Nos. 15 to 19 were used in the bonding of transistors, while Sample Nos. 20 to 24 and Comparative Sample Nos. 4 to 8 were used in the bonding of 16-pin ICs. The shape of each wire loop formed after bonding was observed under a microscope. The bonded wires were also checked microscopically for any breakage occurring at the lead frame. After encapsulation with a molding resin, the IC bonded wire samples (Nos. 20–24 and 4–8) were examined for any deformation by inspection with soft X-rays.

As Table 3 shows, the wire samples prepared in accordance with the present invention (Nos. 15–24) possessed values of elongation, breaking strength and ingot hardness that were suitable for use in the bonding of semiconductor devices; in addition, they exhibited highly reliable characteristics in that they formed loops of normal shape and experienced no breakage during bonding operations. On the other hand, Comparative Sample Nos. 4 to 8 had values of elongation which were too low for them to be used as bonding wires for practical purposes; not only did they form loops of abnormal shapes but also the bonded wires experienced frequent breakage.

The bonding wire samples (Nos. 20–24) of the present invention and comparative samples (Nos. 4–8) experienced no deformation as a result of encapsulation with a molding plastic.

What is claimed is:

1. A very fine wire for bonding a semiconductor device that is made of a high-purity copper consisting essentially of 0–2 ppm of S, 0–2 ppm of Ag, 0–1 ppm of Se and 0–1 ppm of Te, with the total content of these and any other incidental impurities present being held at a level not exceeding 10 ppm, with the balance being copper, said very fine wire having an elongation of 5–22%, a breaking strength of 14–33 kg/mm$^2$, and a Vickers hardness of 38–50, the latter value being measured with respect to said high-purity copper in an ingot form.

2. The very fine wire according to claim 1 wherein said high-purity copper consists essentially of 0–0.5 ppm of S, 0–0.2 ppm of Se and 0–0.2 ppm of Te, with the total content of these and any other incidental impurities present being held at a level not exceeding 5 ppm, with the balance being copper, said very fine wire having an elongation of 14–22%, a breaking strength of 16–26 kg/mm$^2$, and a Vickers hardness of 38–45, the latter value being measured with respect to said high-purity copper in an ingot form.

3. The very fine wire according to claim 1 wherein said high-purity copper consists essentially of 0–0.5 ppm of S, 0–0.2 ppm of Se and 0–0.2 ppm of Te, with the total content of these and any other incidental impurities present being held at a level not exceeding 5 ppm, with the balance being copper, said very fine wire having an elongation of 5 to less than 14%, a breaking stength of 18–28 kg/mm$^2$, and a Vickers hardness of 38–45, the latter value being measured with respect to said high-purity copper in an ingot form.

4. The very fine wire according to claim 1 wherein said high-purity copper consists essentially of 0–0.5 ppm of S, 0–0.5 ppm of Ag, 0–0.2 ppm of Se and 0–0.2 ppm of Te, with the total content of these and any other incidental impurities present being held at a level not exceeding 5 ppm, with the balance being copper, said very fine wire having an elongation of 5–22%, a breaking strength of 16–28 kg/mm$^2$, and a Vickers hardness of 38–45, the latter value being measured with respect to said high-purity copper in an ingot form.

TABLE 3

| Sample | | S | Ag | Se | Te | total | Bright annealing temperature (°C.) | Ingot hardness (Hv) | Wire elongation (%) | Breaking strength of wire (kg/mm$^2$) |
|---|---|---|---|---|---|---|---|---|---|---|
| | | Impurity Levels in Cu Ingot (ppm) | | | | | | | | |
| Samples of the Invention | 15 | 0.20 | 0.25 | 0.11 | 0.12 | 4.0 | 380 | 38.2 | 21.8 | 17.9 |
| | 16 | 0.25 | 0.48 | 0.08 | 0.15 | 4.5 | 380 | 39.9 | 20.9 | 18.3 |
| | 17 | 0.30 | 0.33 | 0.15 | 0.10 | 4.2 | 380 | 40.6 | 19.4 | 19.0 |
| | 18 | 0.40 | 0.40 | 0.10 | 0.17 | 3.9 | 370 | 42.9 | 17.2 | 23.2 |
| | 19 | 0.47 | 0.20 | 0.18 | 0.12 | 4.8 | 350 | 44.3 | 14.2 | 25.1 |
| | 20 | 0.19 | 0.33 | 0.12 | 0.13 | 3.9 | 350 | 38.1 | 13.9 | 18.1 |
| | 21 | 0.25 | 0.35 | 0.09 | 0.10 | 4.4 | 340 | 39.8 | 11.5 | 20.5 |
| | 22 | 0.30 | 0.20 | 0.17 | 0.15 | 4.0 | 300 | 40.9 | 9.8 | 23.5 |
| | 23 | 0.41 | 0.25 | 0.13 | 0.17 | 4.2 | 280 | 42.6 | 7.5 | 25.4 |
| | 24 | 0.48 | 0.36 | 0.18 | 0.12 | 4.7 | 250 | 44.5 | 5.2 | 27.5 |
| Comparative Samples | 4 | 0.60 | 0.29 | 0.13 | 0.12 | 4.8 | 250 | 46.8 | 2.9 | 31.3 |
| | 5 | 0.44 | 0.58 | 0.14 | 0.18 | 4.5 | 250 | 45.9 | 3.3 | 30.5 |
| | 6 | 0.42 | 0.36 | 0.25 | 0.13 | 4.2 | 260 | 45.3 | 3.7 | 29.4 |
| | 7 | 0.39 | 0.34 | 0.16 | 0.23 | 4.5 | 260 | 45.8 | 4.0 | 28.3 |
| | 8 | 0.35 | 0.40 | 0.18 | 0.15 | 5.6 | 260 | 45.9 | 4.2 | 27.8 |

* * * * *